(12) United States Patent
Ahn et al.

(10) Patent No.: US 8,410,585 B2
(45) Date of Patent: Apr. 2, 2013

(54) LEADFRAME AND SEMICONDUCTOR PACKAGE MADE USING THE LEADFRAME

(75) Inventors: Byung Hoon Ahn, Singapore (SG); Jae Hun Ku, Singapore (SG); Young Suk Chung, Seoul (KR); Suk Gu Ko, Goyang-shi (KR); Sung Sik Jang, Hanam-shi (KR); Young Nam Choi, Seoul (KR); Won Chul Do, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 1042 days.

(21) Appl. No.: 11/372,597

(22) Filed: Mar. 10, 2006

(65) Prior Publication Data
US 2006/0151858 A1    Jul. 13, 2006

Related U.S. Application Data

(63) Continuation of application No. 09/845,601, filed on Apr. 27, 2001, now Pat. No. 7,042,068.

(30) Foreign Application Priority Data

| Apr. 27, 2000 | (KR) | ................................. | 2000-22590 |
| Jul. 20, 2000 | (KR) | ................................. | 2000-41644 |
| Oct. 25, 2000 | (KR) | ................................. | 2000-63021 |

(51) Int. Cl.
    *H01L 23/495* (2006.01)
(52) U.S. Cl. ...................... 257/666; 257/676
(58) Field of Classification Search .................. 257/666, 257/676, 787, 692; 438/111, 123
    See application file for complete search history.

(56) References Cited

U.S. PATENT DOCUMENTS

| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |

(Continued)

FOREIGN PATENT DOCUMENTS

| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner* — S. V. Clark

(57) ABSTRACT

Metal leadframes, semiconductor packages made using the leadframes, and methods of making the leadframes and packages are disclosed. In one embodiment, the leadframe includes a rectangular frame. A chip pad and a plurality of leads are within the frame. The lower side of the chip pad and the leads includes one or more vertically recessed horizontal surfaces. The upper side of the chip pad may include a groove around a chip mounting region. In a package, the chip pad supports a semiconductor chip electrically connected to the leads. The lower side of the chip pad and leads are exposed at an exterior surface of the package body. Encapsulant material underfills the recessed lower surfaces of the chip pad and leads, thereby locking them to the encapsulant material. A wire may be reliably bonded to the chip pad within the groove formed in the upper side thereof.

20 Claims, 7 Drawing Sheets

U.S. PATENT DOCUMENTS

| | | | |
|---|---|---|---|
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga | |
| 5,029,386 A | 7/1991 | Chao et al. | |
| 5,041,902 A | 8/1991 | McShane | |
| 5,057,900 A | 10/1991 | Yamazaki | |
| 5,059,379 A | 10/1991 | Tsutsumi et al. | |
| 5,065,223 A | 11/1991 | Matsuki et al. | |
| 5,070,039 A | 12/1991 | Johnson et al. | |
| 5,087,961 A | 2/1992 | Long et al. | |
| 5,091,341 A | 2/1992 | Asada et al. | |
| 5,096,852 A | 3/1992 | Hobson | |
| 5,118,298 A | 6/1992 | Murphy | |
| 5,122,860 A | 6/1992 | Kichuchi et al. | |
| 5,134,773 A | 8/1992 | LeMaire et al. | |
| 5,151,039 A | 9/1992 | Murphy | |
| 5,157,475 A | 10/1992 | Yamaguchi | |
| 5,157,480 A | 10/1992 | McShane et al. | |
| 5,168,368 A | 12/1992 | Gow, III et al. | |
| 5,172,213 A | 12/1992 | Zimmerman | |
| 5,172,214 A | 12/1992 | Casto | |
| 5,175,060 A | 12/1992 | Enomoto et al. | |
| 5,200,362 A | 4/1993 | Lin et al. | |
| 5,200,809 A | 4/1993 | Kwon | |
| 5,214,845 A | 6/1993 | King et al. | |
| 5,216,278 A | 6/1993 | Lin et al. | |
| 5,218,231 A | 6/1993 | Kudo | |
| 5,221,642 A | 6/1993 | Burns | |
| 5,250,841 A | 10/1993 | Sloan et al. | |
| 5,252,853 A | 10/1993 | Michii | |
| 5,258,094 A | 11/1993 | Furui et al. | |
| 5,266,834 A | 11/1993 | Nishi et al. | |
| 5,273,938 A | 12/1993 | Lin et al. | |
| 5,277,972 A | 1/1994 | Sakumoto et al. | |
| 5,278,446 A | 1/1994 | Nagaraj et al. | |
| 5,279,029 A | 1/1994 | Burns | |
| 5,281,849 A | 1/1994 | Singh Deo et al. | |
| 5,294,897 A | 3/1994 | Notani et al. | |
| 5,327,008 A | 7/1994 | Djennas et al. | |
| 5,332,864 A | 7/1994 | Liang et al. | |
| 5,335,771 A | 8/1994 | Murphy | |
| 5,336,931 A | 8/1994 | Juskey et al. | |
| 5,343,076 A | 8/1994 | Katayama et al. | |
| 5,358,905 A | 10/1994 | Chiu | |
| 5,365,106 A | 11/1994 | Watanabe | |
| 5,381,042 A | 1/1995 | Lerner et al. | |
| 5,391,439 A | 2/1995 | Tomita et al. | |
| 5,406,124 A | 4/1995 | Morita et al. | |
| 5,410,180 A | 4/1995 | Fujii et al. | |
| 5,414,299 A | 5/1995 | Wang et al. | |
| 5,417,905 A | 5/1995 | LeMaire et al. | |
| 5,424,576 A | 6/1995 | Djennas et al. | |
| 5,428,248 A | 6/1995 | Cha | |
| 5,435,057 A | 7/1995 | Bindra et al. | |
| 5,444,301 A | 8/1995 | Song et al. | |
| 5,452,511 A | 9/1995 | Chang | |
| 5,454,905 A | 10/1995 | Fogelson | |
| 5,474,958 A | 12/1995 | Djennas et al. | |
| 5,484,274 A | 1/1996 | Neu | |
| 5,493,151 A | 2/1996 | Asada et al. | |
| 5,508,556 A | 4/1996 | Lin | |
| 5,517,056 A | 5/1996 | Bigler et al. | |
| 5,521,429 A * | 5/1996 | Aono et al. | 257/676 |
| 5,528,076 A | 6/1996 | Pavio | |
| 5,534,467 A | 7/1996 | Rostoker | |
| 5,539,251 A | 7/1996 | Iverson et al. | |
| 5,543,657 A | 8/1996 | Diffenderfer et al. | |
| 5,544,412 A | 8/1996 | Romero et al. | |
| 5,545,923 A | 8/1996 | Barber | |
| 5,581,122 A | 12/1996 | Chao et al. | |
| 5,592,019 A | 1/1997 | Ueda et al. | |
| 5,592,025 A | 1/1997 | Clark et al. | |
| 5,594,274 A | 1/1997 | Suetaki | |
| 5,595,934 A | 1/1997 | Kim | |
| 5,604,376 A | 2/1997 | Hamburgen et al. | |
| 5,608,265 A | 3/1997 | Kitano et al. | |
| 5,608,267 A | 3/1997 | Mahulikar et al. | |
| 5,625,222 A | 4/1997 | Yoneda et al. | |
| 5,633,528 A | 5/1997 | Abbott et al. | |
| 5,639,990 A | 6/1997 | Nishihara et al. | |
| 5,640,047 A | 6/1997 | Nakashima | |
| 5,641,997 A | 6/1997 | Ohta et al. | |
| 5,643,433 A | 7/1997 | Fukase et al. | |
| 5,644,169 A | 7/1997 | Chun | |
| 5,646,831 A | 7/1997 | Manteghi | |
| 5,650,663 A | 7/1997 | Parthasaranthi | |
| 5,661,088 A | 8/1997 | Tessier et al. | |
| 5,665,996 A | 9/1997 | Williams et al. | |
| 5,673,479 A | 10/1997 | Hawthorne | |
| 5,683,806 A | 11/1997 | Sakumoto et al. | |
| 5,689,135 A | 11/1997 | Ball | |
| 5,696,666 A | 12/1997 | Miles et al. | |
| 5,701,034 A | 12/1997 | Marrs | |
| 5,703,407 A | 12/1997 | Hori | |
| 5,710,064 A | 1/1998 | Song et al. | |
| 5,723,899 A | 3/1998 | Shin | |
| 5,724,233 A | 3/1998 | Honda et al. | |
| 5,726,493 A | 3/1998 | Yamashita | |
| 5,736,432 A | 4/1998 | Mackessy | |
| 5,745,984 A | 5/1998 | Cole, Jr. et al. | |
| 5,753,532 A | 5/1998 | Sim | |
| 5,753,977 A | 5/1998 | Kusaka et al. | |
| 5,766,972 A | 6/1998 | Takahashi et al. | |
| 5,770,888 A | 6/1998 | Song et al. | |
| 5,776,798 A | 7/1998 | Quan et al. | |
| 5,783,861 A | 7/1998 | Son | |
| 5,801,440 A | 9/1998 | Chu et al. | |
| 5,814,877 A | 9/1998 | Diffenderfer et al. | |
| 5,814,881 A | 9/1998 | Alagaratnam et al. | |
| 5,814,883 A | 9/1998 | Sawai et al. | |
| 5,814,884 A | 9/1998 | Davis et al. | |
| 5,817,540 A | 10/1998 | Wark | |
| 5,818,105 A | 10/1998 | Kouda | |
| 5,821,457 A | 10/1998 | Mosley et al. | |
| 5,821,615 A | 10/1998 | Lee | |
| 5,834,830 A | 11/1998 | Cho | |
| 5,835,988 A | 11/1998 | Ishii | |
| 5,844,306 A | 12/1998 | Fujita et al. | |
| 5,856,911 A | 1/1999 | Riley | |
| 5,859,471 A | 1/1999 | Kuraishi et al. | |
| 5,866,939 A | 2/1999 | Shin et al. | |
| 5,871,782 A | 2/1999 | Choi | |
| 5,874,784 A | 2/1999 | Aoki et al. | |
| 5,877,043 A | 3/1999 | Alcoe et al. | |
| 5,886,397 A | 3/1999 | Ewer | |
| 5,886,398 A | 3/1999 | Low et al. | |
| 5,894,108 A | 4/1999 | Mostafazadeh et al. | |
| 5,897,339 A | 4/1999 | Song et al. | |
| 5,900,676 A | 5/1999 | Kweon et al. | |
| 5,903,049 A | 5/1999 | Mori | |
| 5,903,050 A | 5/1999 | Thurairajaratnam et al. | |
| 5,909,053 A | 6/1999 | Fukase et al. | |
| 5,915,998 A | 6/1999 | Stidham et al. | |
| 5,917,242 A | 6/1999 | Ball | |
| 5,939,779 A | 8/1999 | Kim | |
| 5,942,794 A | 8/1999 | Okumura et al. | |
| 5,951,305 A | 9/1999 | Haba | |
| 5,959,356 A | 9/1999 | Oh | |
| 5,969,426 A | 10/1999 | Baba et al. | |
| 5,973,388 A * | 10/1999 | Chew et al. | 257/676 |
| 5,976,912 A | 11/1999 | Fukutomi et al. | |

| | | |
|---|---|---|
| 5,977,613 A | 11/1999 | Takata et al. |
| 5,977,615 A | 11/1999 | Yamaguchi et al. |
| 5,977,630 A * | 11/1999 | Woodworth et al. .......... 257/712 |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,473 A | 9/2000 | Costantini et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,166,430 A * | 12/2000 | Yamaguchi .................. 257/666 |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 * | 3/2001 | Huang et al. .................. 257/787 |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 * | 3/2001 | Nakayama et al. ............ 257/696 |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,246,111 B1 * | 6/2001 | Huang et al. .................. 257/675 |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 * | 8/2001 | Glenn et al. .................. 257/684 |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Kamezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,399,415 B1 * | 6/2002 | Bayan et al. .................. 438/106 |
| 6,400,004 B1 | 6/2002 | Fan et al. |
| 6,410,979 B2 * | 6/2002 | Abe .............................. 257/684 |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 * | 8/2002 | Su et al. ........................ 257/666 |
| 6,444,499 B1 | 9/2002 | Swiss et al. |
| 6,448,633 B1 * | 9/2002 | Yee et al. ...................... 257/666 |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Huang et al. |
| 6,476,474 B1 | 11/2002 | Hung |
| 6,482,680 B1 | 11/2002 | Khor et al. |
| 6,483,178 B1 * | 11/2002 | Chuang ........................ 257/672 |
| 6,498,099 B1 | 12/2002 | McLellan et al. |
| 6,498,392 B2 | 12/2002 | Azuma |
| 6,507,096 B2 | 1/2003 | Gang |
| 6,507,120 B2 | 1/2003 | Lo et al. |
| 6,534,849 B1 | 3/2003 | Gang |
| 6,545,332 B2 * | 4/2003 | Huang .......................... 257/433 |
| 6,545,345 B1 | 4/2003 | Glenn et al. |
| 6,559,525 B2 | 5/2003 | Huang |
| 6,566,168 B2 | 5/2003 | Gang |
| 6,580,161 B2 * | 6/2003 | Kobayakawa ................ 257/676 |
| 6,583,503 B2 | 6/2003 | Akram et al. |
| 6,603,196 B2 | 8/2003 | Lee et al. |
| 6,624,005 B1 | 9/2003 | DiCaprio et al. |
| 6,667,546 B2 | 12/2003 | Huang et al. |
| 6,700,189 B2 * | 3/2004 | Shibata ........................ 257/684 |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |

FOREIGN PATENT DOCUMENTS

| | | |
|---|---|---|
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |

| | | |
|---|---|---|
| JP | 60116239 | 8/1985 |
| JP | 60195957 | 10/1985 |
| JP | 60231349 | 11/1985 |
| JP | 6139555 | 2/1986 |
| JP | 61248541 | 11/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 9/1992 |
| JP | 512947 | 5/1993 |
| JP | 5166992 | 7/1993 |
| JP | 5283460 | 10/1993 |
| JP | 6061401 | 3/1994 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 96-4284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9260568 | 10/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 11307675 | 11/1999 |
| JP | 00150765 | 5/2000 |
| JP | 556398 | 10/2000 |
| JP | 200204397 | 8/2002 |
| KR | 941979 | 1/1994 |
| KR | 19940010938 | 5/1994 |
| KR | 19950018924 | 6/1995 |
| KR | 19950041844 | 11/1995 |
| KR | 19950044554 | 11/1995 |
| KR | 19950052621 | 12/1995 |
| KR | 1996074111 | 12/1996 |
| KR | 9772358 | 11/1997 |
| KR | 100220154 | 6/1999 |
| KR | 20000072714 | 12/2000 |
| KR | 20000086238 | 12/2000 |
| KR | 2001060648 | 3/2001 |
| KR | 0049944 | 6/2002 |
| WO | 9956316 | 11/1999 |
| WO | 9967821 | 12/1999 |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.

Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

LEADFRAME AND SEMICONDUCTOR PACKAGE MADE USING THE LEADFRAME

CROSS-REFERENCE TO RELATED APPLICATIONS

The present application is a continuation of U.S. application Ser. No. 09/845,601 entitled LEADFRAME AND SEMICONDUCTOR PACKAGE USING THE LEADFRAME filed Apr. 27, 2001 and issued as U.S. Pat. No. 7,042,068 on May 9,2006, which claims priority to Korean Patent Application Nos. 2000-22590 filed Apr. 27, 2000, 2000-41644 filed Jul. 20, 2000, and 2000-63021 filed Oct. 25, 2000.

STATEMENT RE: FEDERALLY SPONSORED RESEARCH/DEVELOPMENT

Not Applicable

BACKGROUND OF THE INVENTION

A typical package for a semiconductor chip includes an internal leadframe, which functions as a substrate for the package. The leadframe includes a central metal chip pad and a plurality of leads. A body of a hardened, insulative encapsulant material covers the chip, chip pad, and an inner portion of each of the leads. The encapsulant material is provided both above and below the chip pad and leads.

The semiconductor chip is mounted on the chip pad and is electrically connected to the leads. In particular, the chip includes a plurality of bond pads, each of which is electrically connected by a conductor (e.g., a wire) to an encapsulated inner portion of one of the leads. An outer portion of each lead extends outward from the body of encapsulant material, and serves as an input/output terminal for the package. The outer portion of the leads may be bent into various configurations, such as a J lead configuration or a gull wing configuration.

Lately, practitioners have attempted to make packages thinner by providing the chip pad and leads at a bottom surface of the body of encapsulant material, rather than in the middle of the body of encapsulant material. Such packages enjoy a lower height than the standard leadframe packages mentioned above, since there is no encapsulant beneath the chip pad and leads.

In addition, there is a demand for smaller and smaller packages. Leadframes for such packages have themselves become smaller and thinner.

BRIEF SUMMARY

The present invention includes leadframes, semiconductor packages made using the leadframes, and methods of making the leadframes and packages. The packages of the present invention can be made very thin, because the leads are exposed at a bottom surface of the encapsulant material. Moreover, the packages are reliable, because encapsulant material is provided under one or more portions of the leads, thereby locking the leads to the package body of encapsulant material. Further, encapsulant material can be provided under a peripheral lip of a chip pad upon which the chip is mounted, thereby locking the chip pad to the encapsulant material.

For instance, a metal leadframe in accordance with one embodiment of the present invention includes a rectangular frame. A chip pad is inside of and integrally connected to the frame. A plurality of leads extend from the frame toward the die pad. Each lead includes an inner end adjacent to the chip pad, an outer end integrally connected to the frame, a first surface, and a second surface opposite the first surface. The second surface of each lead is split into a first region and a second region by a groove including a recessed horizontal third surface that extends across the lead. The first region of the second surface of the lead is between the frame and the third surface, and the second region is between the third surface and the inner end of the lead. The chip pad may include a first surface, a second surface opposite a central portion of the first surface, and a third surface opposite a peripheral portion of the first surface and surrounding the second surface. The third surface is recessed from the second surface. The first surface of the chip pad may include a groove extending in a ring adjacent to peripheral sides of the chip pad.

A semiconductor package in accordance with another embodiment of the invention may be made from such a leadframe. A semiconductor chip is mounted on the first surface of the chip pad and is in an electrical connection with the first surface of at least some of the leads. A package body of a hardened encapsulant material covers the chip, at least the first surface of the chip pad, and the first surface and third surface of the leads. The first and second regions of the second surface of the leads, and typically the second surface of the chip pad, are exposed in a plane of a first exterior surface of the package body for externally connecting the package to a motherboard or the like. Further, in the case where a groove is formed in the first surface of the die pad, the groove may surround the chip, and the chip may be electrically connected to the chip pad by a wire bonded within the groove.

These and other aspects of the present invention may be better appreciated upon consideration of the exemplary embodiments that are shown in the figures and discussed below.

DETAILED DESCRIPTION

The present invention will now be described in connection with the exemplary embodiments described below with reference to the accompanying drawings.

Figure 1A:
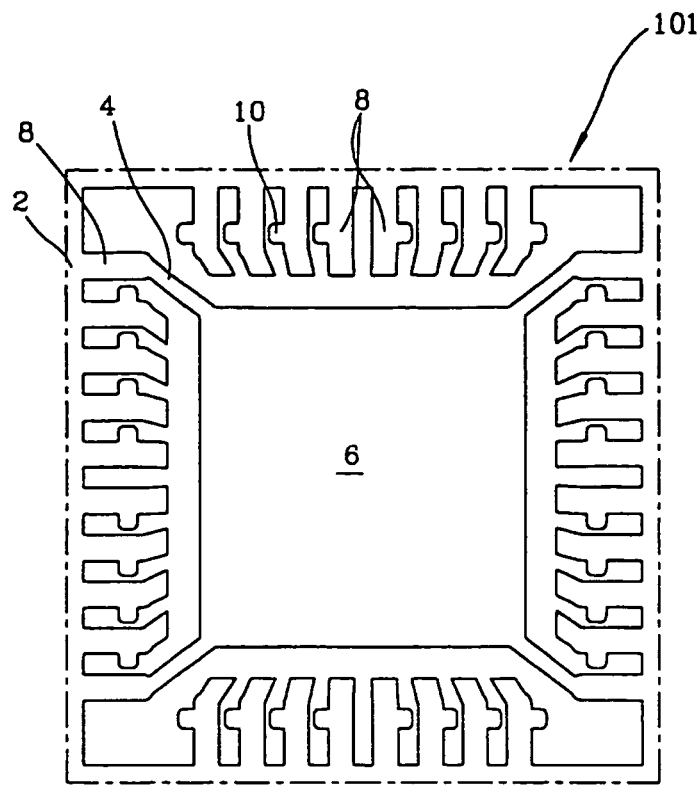
FIG. 1a is a top plan view of a leadframe according to a first embodiment of the present invention.
Figure 1B:
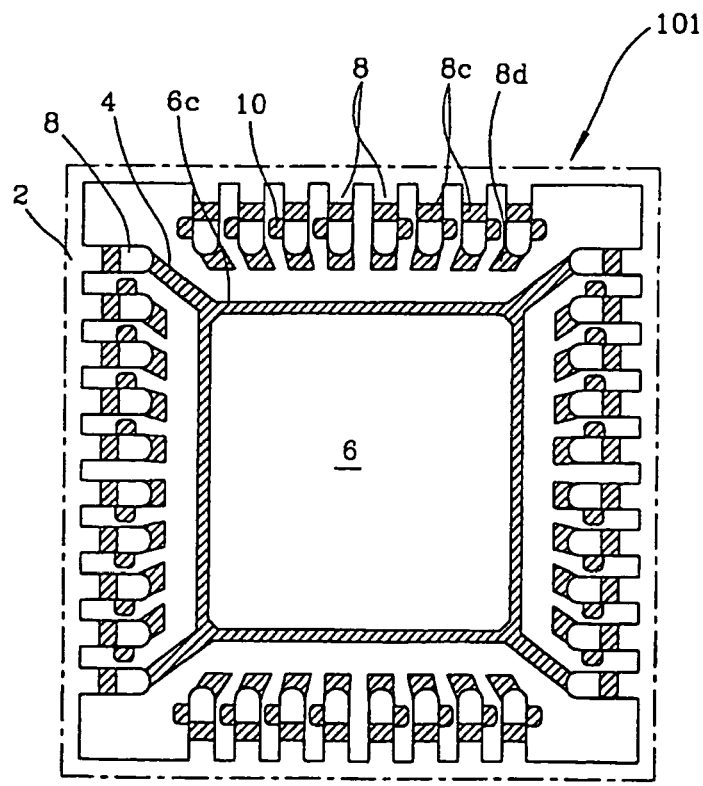
FIG. 1b is a bottom plan view of the leadframe according to the first embodiment of the present invention.
Figure 1C:
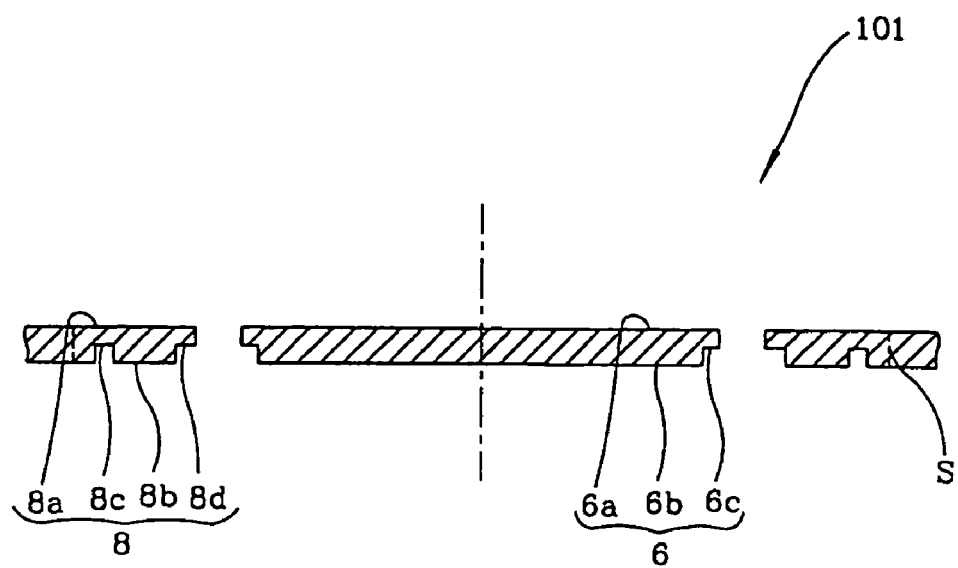
FIG. 1c is a cross-sectional side view of the leadframe according to the first embodiment of the present invention.
Figure 2A:
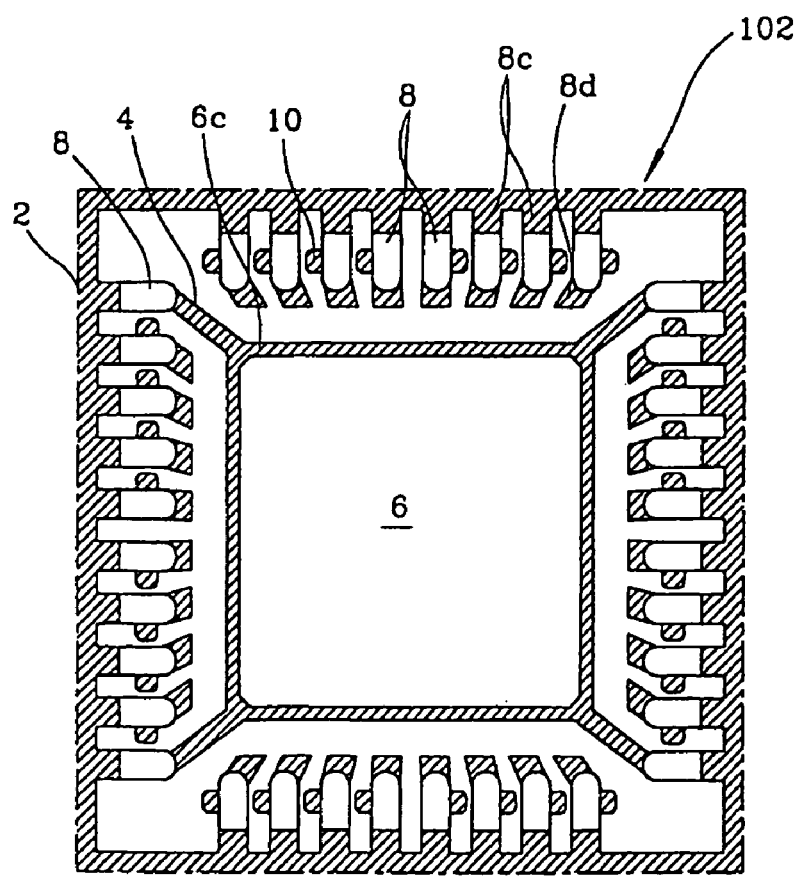
FIG. 2a is a bottom plan view of a leadframe according to a second embodiment of the present invention.
Figure 2B:
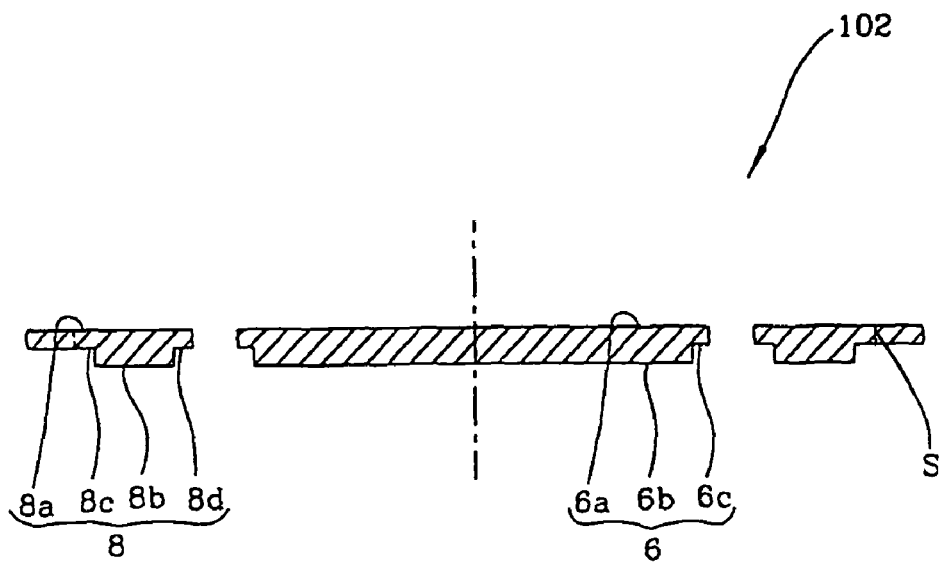
FIG. 2b is a cross-sectional side view of the leadframe according to the second embodiment of the present invention.
Figure 3A:
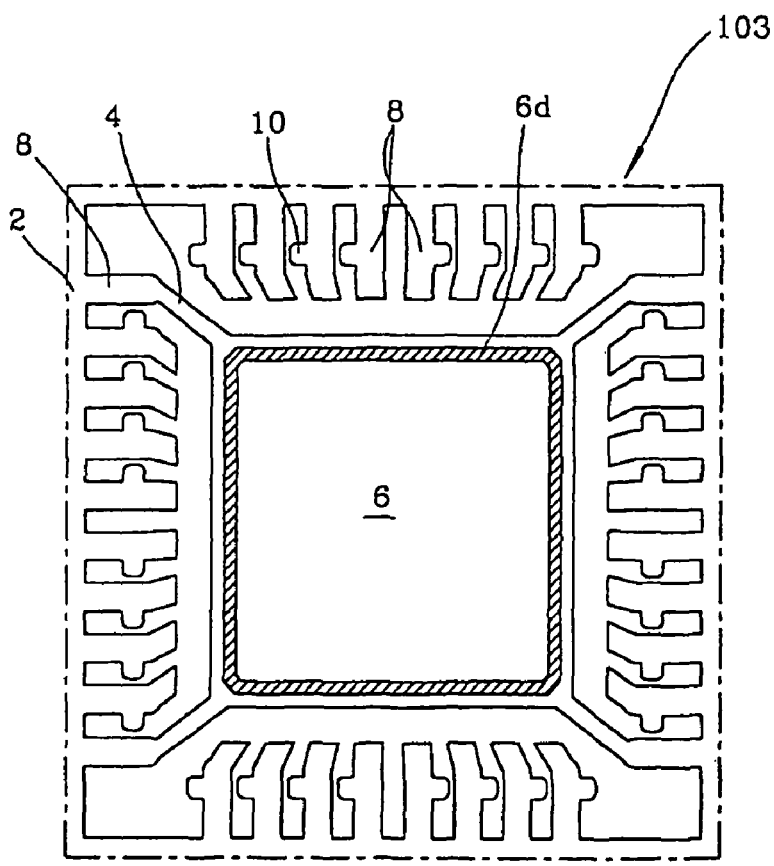
FIG. 3a is a top plan view of a leadframe according to a third embodiment of the present invention.
Figure 3B:
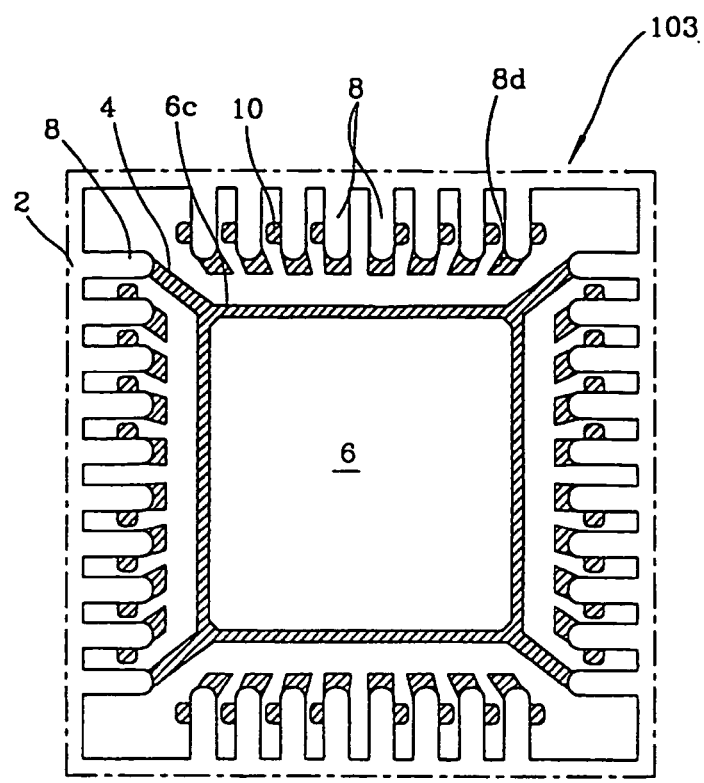
FIG. 3b is a bottom plan view of the leadframe according to the third embodiment of the present invention.
Figure 3C:
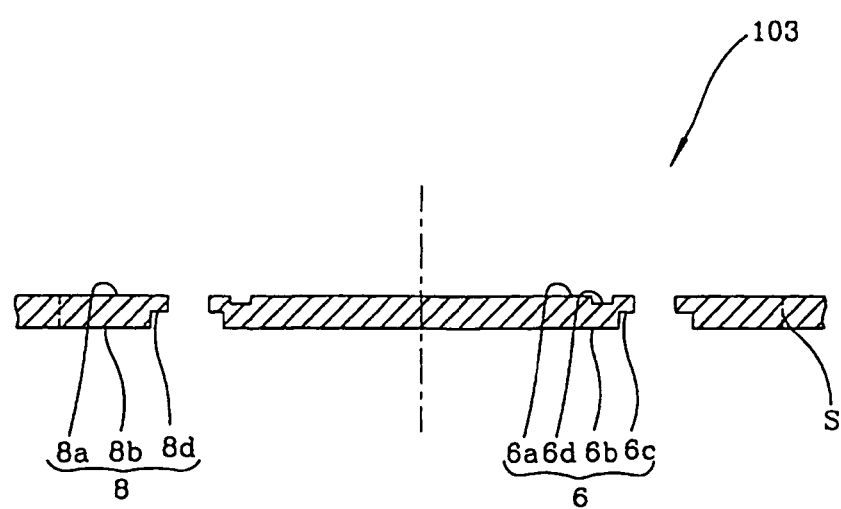
FIG. 3c is a cross-sectional side view of the leadframe according to the third embodiment of the present invention.
Figure 4A:
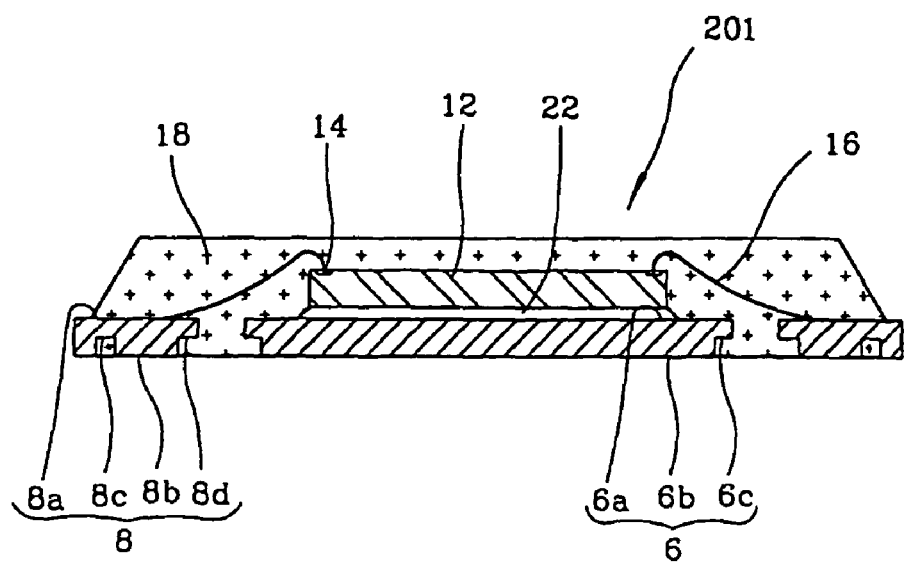
FIG. 4a is a cross-sectional side view of a semiconductor package made using the leadframe of FIGS. 1a through 1c.
Figure 4B:
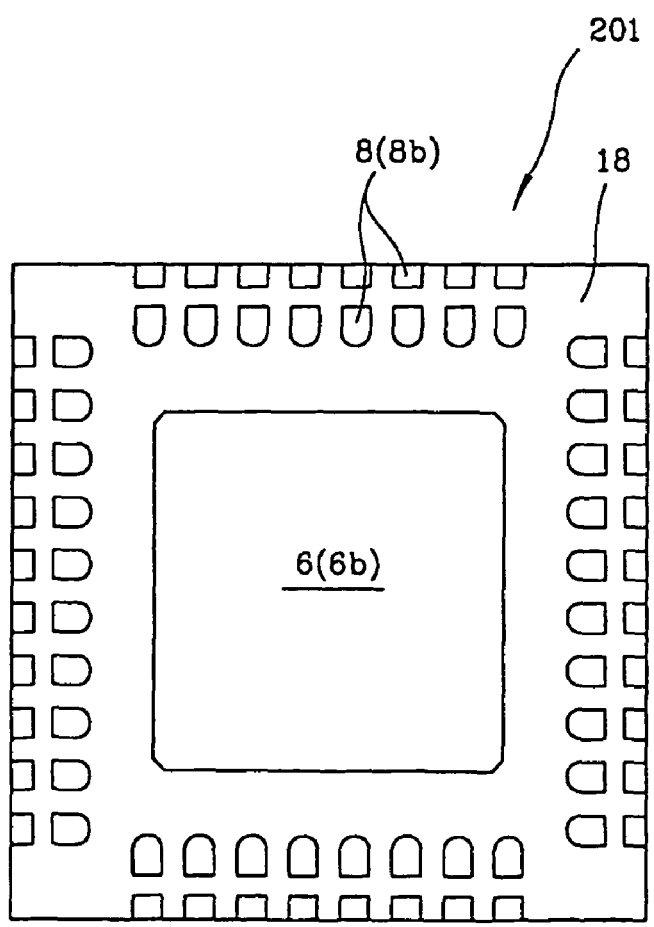
FIG. 4b is a bottom plan view of the semiconductor package made using the leadframe of FIGS. 1a through 1c.
Figure 5A:
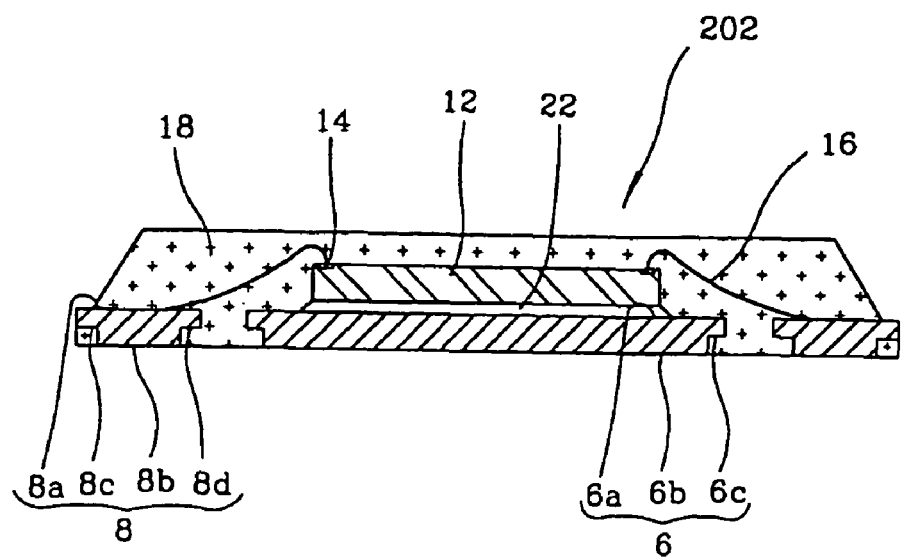
FIG. 5a is a cross-sectional side view of a semiconductor package made using the leadframe of FIGS. 2a and 2c.
Figure 5B:
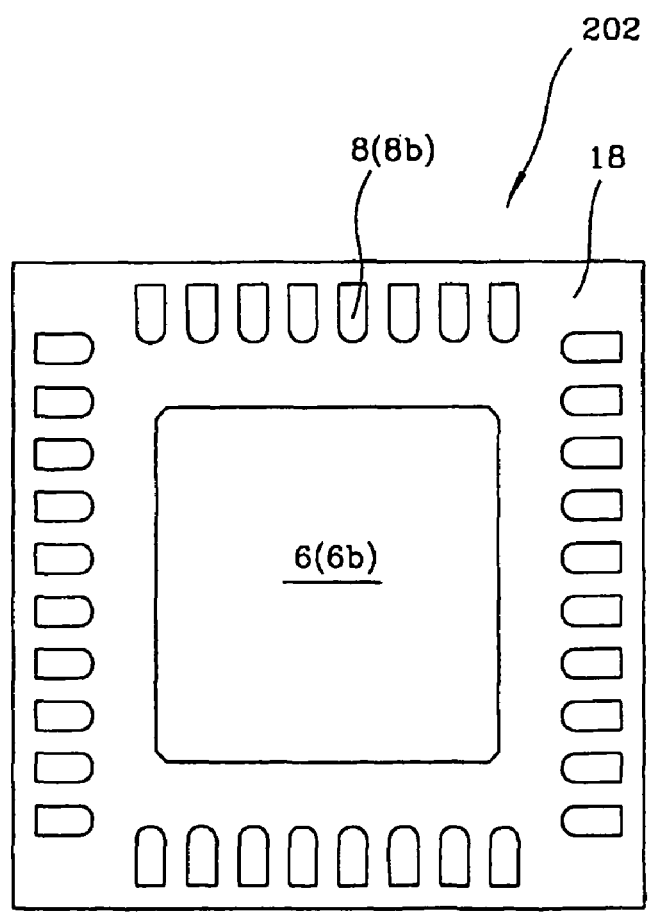
FIG. 5b is a bottom plan view of the semiconductor package made using the leadframe of FIGS. 2a and 2b.
Figure 6A:
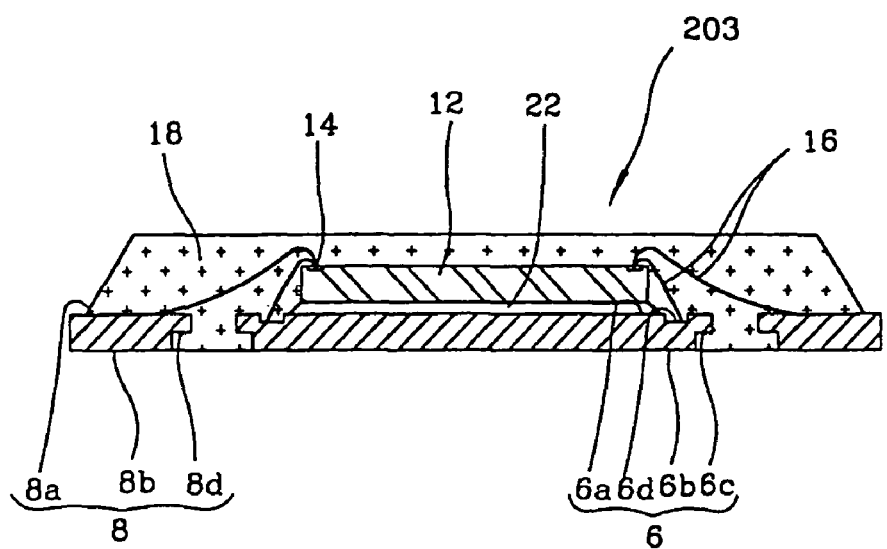
FIG. 6a is a cross-sectional side view of a semiconductor package made using the leadframe of FIGS. 3a through 3c.
Figure 6B:
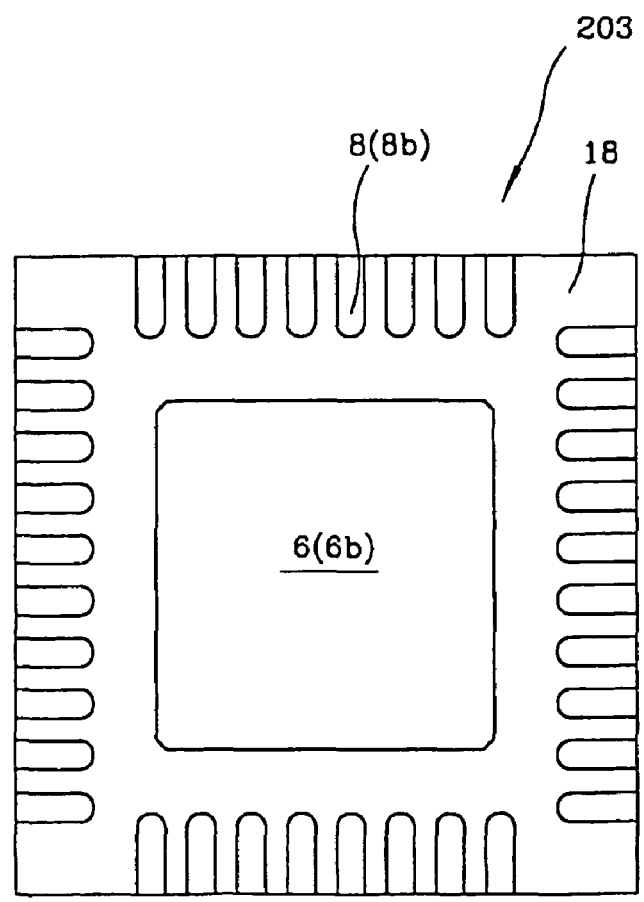
FIG. 6b is a bottom plan view of the semiconductor package made using the leadframe of FIGS. 3a through 3c.

First, FIGS. 1a through 1c are a top plan view, a bottom plan view and a cross-sectional side view, respectively, of a leadframe 101 according to a first embodiment of the present invention. FIGS. 2a and 2b are a bottom plan view and a cross-sectional side view of a leadframe 102 according to a second embodiment of the present invention. FIGS. 3a through 3c are a top plan view, a bottom plan view and a cross-sectional side view of a leadframe 103 according to a third embodiment of the present invention. In FIGS. 1b, 2a, 3a, and 3b, the shaded areas are vertically recessed from the laterally adjacent non-shaded surfaces. FIGS. 4a and 4b are a cross-sectional side view and a bottom view, respectively, of a semiconductor package 201 made using the leadframe 101 of FIGS. 1a through 1c. FIGS. 5a and 5b are a cross-sectional side view and a bottom view, respectively, of the semiconductor package 202 made using the leadframe 102 of the FIGS. 2a and 2b. Finally, FIGS. 6a and 6b are cross-sectional side view and bottom plan view, respectively, of a semiconductor package 203 made using the leadframe 103 of FIGS. 3a through 3c. In the drawings, like features typically have the same reference numbers, in which case the same discussion applies across the various embodiments.

Generally, a leadframe for a semiconductor package is manufactured by mechanically stamping or chemically etching continuous metal strips.

The leadframes 101, 102 and 103 may be made of a common leadframe metal, such as copper(Cu), copper alloy(Cu Alloy), Alloy 37 (nickel(Ni) 37% and steel(Fe) 55%) and copper-plated steel, according to the application.

Referring to leadframe 101 of FIGS. 1a, 1b, and 1c, a plate type frame 2, which encloses a space of a prescribed size, is formed at the center of the leadframe. A rectangular chip pad 6 is at the center of the space within the frame is connected at its four corners and supported by four tie bars 4. Each tie bar 4 is integrally connected between an inner end of any one of a plurality of leads 8 extending inward from the frame 2 and a corner of chip pad 6. In this example, the tie bars 4 are each integrally connected to a lead 8 that is adjacent to a corner of frame 2.

A plurality of leads 8 extend inward from frame 2. An outer end of each lead 8 is integrally connected to the frame 2 and the opposite inner end of the lead 8 is either connected to a tie bar 4 or is a free end that extends to a point adjacent to, but not contacting, chip pad 6.

In leadframe 101, the inner end of the leads 8 that are not connected to a tie bar 4, i.e., the free inner ends, extend from frame 2 toward chip pad 6. There are 32 such leads 8, with eight leads 8 between pairs of the tie bars 4.

The free end of some of the leads 8 that are directed toward chip pad 6 are bent at angles toward chip pad 6. The bend helps to lock the lead 8 to encapsulant material later applied to the leadframe. Each lead 8 may have an anchor ear 10 projecting from a side of the lead 8. The anchor ear 10 serves to restrict an encapsulant 18 (see FIG. 4a) in the finished semiconductor package as well as to prevent the lead 8 from being pulled out from encapsulant 18 horizontally or vertically. Selectively, to further restrict the encapsulant 18, a concave hole or a depressed part may be formed in the lead 8 in place of the anchor ear 10. It will be appreciated that the anchor ear 10 is optional.

Here, the number, position and path of the leads 8 of the leadframes 101, 102 and 103 described herein are exemplary only, and may be changed according to the application. Furthermore, the leads 8 may be designed suitable for the number and position of input-output pads 14 of a semiconductor chip 12 (see FIG. 4a) to be mounted on the leadframe. Additionally, in the drawings, the leadframes 101, 102 and 103 are in the form of a square, but may be in the form of a non-equilateral rectangle. Moreover, in the drawings, the leads 8 are formed adjacent to all four sides of chip pad 6, as in a quad package, but may be formed adjacent to only two parallel sides of chip pad 6, as in a dual package. Also, only two tie bars 4 may be formed to support chip pad 6. Further, the tie bars 4 may be integrally connected between frame 2 and chip pad 6 rather than between a lead 8 and chip pad 6.

Chip pad 6 of leadframe 101, 102, and 102, includes a first surface 6a of approximately flat type, a second surface 6b of approximately flat type opposed to a central portion of first surface 6a, and a third surface 6c of approximately flat type opposed to a peripheral portion of the first surface 6a. The third surface 6c is vertically recessed in a predetermined interval from the second surface 6b. Third surface 6c extends fully around second surface 6b and chip pad 6, so as to form a lip beginning at first surface 6a and ending a selected distance from second surface 6b.

A center area of the chip pad 6 has a first thickness between the first surface 6a and the second surface 6b. A peripheral area around chip pad 6 has a second thickness between first surface 6a and third surface 6c that is less (e.g., about half) than the first thickness. The shaded parts in FIGS. 1b, 2a, and 3a indicate the third surface 6a in an embodiment where third surface 6c circumscribes chip pad 6.

Alternatively, with reference to FIGS. 3a and 3c, chip pad 6 may have a groove bottomed by a horizontal fourth surface 6d formed in the first surface 6a and leadframe 103 opposed to the second surface 6b. Fourth surface 6d is depressed a predetermined depth in a peripheral region of first surface 6a, and the semiconductor chip 12 is mounted inward of the groove (see FIG. 6a). For an example, the groove having fourth surface 6d may be in the form of a rectangular ring located inward of third surface 6c adjacent a periphery of chip pad 6, with chip 12 located within the ring (see FIGS. 3a, 3c, and 6b).

The shaded part of FIGS. 1b, 2a, 3b, and tie bar 4 have the same second thickness as is between the first surface 6a and the third surface 6c of the chip pad 6. That is, the underside of tie bars 4 also are recessed.

Referring to FIGS. 1c, 2b, and 3c, the lead 8 includes a first surface 8a of approximately flat type and a second surface 8b of approximately flat type opposed to the first surface 8a. In FIGS. 1c, 2b, and 3c, the reference letter S indicates a virtual sawing line through leads 8 where the leads are cut during a manufacturing process to singulate the semiconductor package. The package also can be singulated by punching through the leads 8 at line S.

Referring to leadframe 101 of FIGS. 1b and 1c, a horizontal recessed third surface 8c may be provided opposite first surface 8a in a groove in second surface 8b across lead 8. Therefore, two regions of second surface 8b exist on each lead on either side of third surface 8c. The first region of second surface 8b is between frame 2 and third surface 8c and the second region of second surface 8c is between third surface 8c and the inner end of lead 8. Optionally, a horizontal fourth surface 8d may be provided opposite first surface 8a and recessed from second surface 8b beginning at the inner end of the lead 8 immediately adjacent to chip pad 6. Anchor ears 10 also are recessed from second surface 8b of lead 8.

Referring to leadframe 102 of FIGS. 2a and 2b, the recessed horizontal third surface 8c of the leads 8 also may be formed in an area of the second surface 8b close to frame 2 and at sawing line S, so that there is only one region of second surface 8b. Optionally, a recessed horizontal fourth surface 8d may be formed beginning at the inner end of the lead 8 adjacent chip pad 6 and extending to second surface 8b, as described above. In this embodiment, the single area of second surface 8b is fully inward of the inner and outer ends of the lead 8.

Referring to leadframe 103 of FIGS. 3b and 3c, second surface 8b extends to sawing line S and frame 2. A horizontal fourth surface 8d is recessed from second surface 8b at the inner end of the lead 8. Anchor ear 10 also is recessed from second surface 8b. There is no third surface 8c as in leadframe 101.

Referring to FIGS. 1c, 2b, and 3c, leads 8 have a first thickness between first surface 8a and second surface 8b, and a lesser second thickness (e.g., 50% less) between first surface 8a and the recessed third and fourth surfaces 8c and 8d. Typically these first and second thicknesses of leads 8 are the same as the first and second thicknesses mentioned above for chip pad 6.

In packages made from leadframe 101, 102, and 103, the second surface 8b formed either as one or two regions on the leads 8 serves to electrically connect the semiconductor package 201, 202, and 203 (see FIGS. 4a, 4b, 6a, 5b, 6a, and 6b) to the mother board, thereby indirectly connecting packaged chip 12 to the motherboard. The first surface 6a, the recessed third surface 6c and the optional fourth surface 6d of the chip pad 6, and the first surface 8a, the recessed third surface 8c, and the recessed optional fourth surface 8d of the lead 8 are all located inside encapsulant 18. The recessed lower third surfaces 6c, 8c, and fourth surface 8d are underfilled by encapsulant 18. The thickness of the chip pad 6 and the leads 8 of the leadframes 101, 102 and 103 maybe about 0.15 mm to 0.50 mm and the depth of the recess formed by the third surfaces 6c, 8c, fourth surface 8d, and fourth surface 6d may be about 0.075 mm to 0.25 mm. As the percentage, the depth of the recessed part formed by the third surfaces 6c, 8c, fourth surface 8d, and the fourth surface 6d may be about 50% or 33% to 75% of the total thickness of the chip pad 6 or lead 8. Of course, these values are example values. Real values may be changed according to the application.

The leadframes 101, 102 and 103 may be formed of a milled metal strip by a common chemical wet etching process. As known, chemical etching (called also chemical milling) uses photolithography, photoresist and a chemical solution for etching a pattern into the metal strip are used. Generally, the photoresist layer is formed on one side or two sides of the strip. Next, the photoresist layer is exposed to light through a mask, on which a desired pattern is formed. The chemical solution is applied to the one or two sides of the strip. The exposed areas of the strip are etched and removed, and thereby the desired pattern remains in the metal strip.

By performing the etching twice, the leadframes 101, 102 and 103 can be formed. The first etching step is carried out on the one or two sides of the strip through a photoresist pattern on the one or two sides of the strip. The first etching step completely passes through predetermined regions of the metal strip in order to form the overall pattern of leadframes 101, 102 and 103.

Next, to form the recessed regions, a second photoresist pattern is formed on predetermined areas of one side or two sides of the leadframes 101, 102 and 103. For example, a circumferential area of the chip pad 6 and a selected area of the lead 8 are not covered by the second photoresist pattern, and therefore, are etched by a second etching step. The second etching step is carried out on the one or two sides of the leadframes 101, 102 and 103 through the second photoresist pattern. As shown in FIGS. 1b, 1c, 2a, 2b, 3a and 3b, in the second etching step, the depressed surfaces are formed in the leadframes 101, 102 and 103. For example, the third surface 6c and the fourth surface 6d of chip pad 6, and third surfaces 8c and fourth surface 8d of the leads 8 are formed during the second etching step. Anchor ears 10 and tie bars 4 are also partially removed in their thicknesses by the second etching step.

During the second etching step, after the chemical solution removes a desired amount of the vertical thickness of the chip pad 6, leads 8 anchor ears 10, and tie bars 4, the second etching step is stopped. The second etching step is carried out in such a manner that the recessed lower surfaces of chip pad 6 and leads 8 will be within encapsulant 18 of the package to be formed with leadframes 101, 102, and 103 (see FIGS. 4a, 5a, and 6a), e.g., the encapsulant 18 fills in under the third surface 6c of the chip pad 6 and the third surface 8c and fourth surface 8d of the leads 8.

In general, in the second etching step, the thickness of the selected areas of chip pad 6 and leads 8 is removed to about 50% of their original thickness, but the amount removed may be within the range of about 33% to 75% of the thickness of the leadframe, depending on the application. The second surface 6b of chip pad 6 and the inner end of second surface 8b of leads 8 have rounded inner ends in the embodiments shown in FIGS. 4b, 5b, and 6c. This may reduce package stresses. Additionally, the leadframes 101, 102, or 103 may be formed by a first step of mechanically stamping the whole pattern of the leadframe and by a second step of chemically etching partially through the chip pad 6 and the lead 8 of the stamped leadframe and other portions of the leadframe to form the recessed surfaces.

Meanwhile, after the etching step, the first surface 8a of the lead 8 of the leadframes 101, 102 and 103 may be plated with metal, such as gold(Au), silver(Ag), nickel(Ni), palladium (Pd), copper(Cu) and others, in order to better bond to conductive wires 16 of the package (see FIGS. 4a, 5a, and 6a). Furthermore, to facilitate connection of the second surface 8b of the leads 8 to the mother board, the second surface 8b may be plated with a metal such as gold, nickel, palladium, inconel, solder of lead and tin, or tantalum.

Referring to FIGS. 4a and 4b, the semiconductor package 201 includes chip pad 6 and a plurality of leads 8. The chip pad 6 has the first surface 6a of approximately flat type, the second surface 6b of approximately flat type opposite a central portion of first surface 6a, and the encapsulant-covered third surface 6c of approximately flat type. The third surface 6c is opposed to a peripheral portion of the first surface 6a fully around second surface 6b. The third surface 6c is vertically recessed from second surface 6b.

The leads 8 of semiconductor package 201 extend toward the chip pad 6 without contacting to the chip pad 6. Each lead 8 has the first surface 8a of approximately flat type, the second surface 8b of approximately flat type, the third surface 8c of approximately flat type, and an optional fourth surface 8d of approximately flat type. The second surface 8b, the third surface 8c and the fourth surface 8d are opposed to respective portions of the first surface 8a. The third surface 8c and fourth surface 8d are vertically between the first surface 8a and the second surface 8b, i.e., are vertically recessed from second surface 8b.

Here, the frame of the leadframe is removed along the sawing line S (see FIG. 1c) in a sawing step or punching step of the manufacturing process of the semiconductor package, wherein a finished package is singulated from the strip of leadframes. A small stub including the outer end of leads 8 may extends beyond the peripheral sides of encapsulant 18.

Referring to FIGS. 4a and 4b, third surface 8c is within a horizontal groove that splits second surface 8c between the peripheral edge of encapsulant 18 and fourth surface 8d. Fourth surface 8d begins at the inner end of the lead 8 adjacent chip pad 6 and extends a short distance outward toward the periphery of encapsulant 18. Fourth surface 8d is covered by encapsulant 18. Since third surface 8c is at an intermediate portion of lead 8, the second surface 8b, which is exposed at the lower exterior surface of package 201, is split into two exposed regions by the encapsulant 18 that covers third surface 8c. Fourth surface 8d is formed by etching partially through lead 8 in a manner that leaves the inner end of the exposed inner region of second surface 8b with a rounded profile.

A semiconductor chip 12, into which various electronic circuits are integrated, is mounted on the center of the first surface 6a of the chip pad 6 and is attached with a bonding means 22. The semiconductor chip 12 has a plurality of input-output pads 14 formed on an active upper surface thereof. The bonding of the semiconductor chip 12 to chip pad 6 may be performed with common semiconductor chip bonding means, such as common epoxy adhesives, adhesive films or adhesive tapes.

Some or all of the input-output pads 14 of the semiconductor chip 12 are electrically connected to the first surface 8a of a respective one of the leads 8 by a conductive wire 16 or equivalent conductor. Here, as described above, the first surface 8a of the lead 8 may be plated with a common metal, such as gold, silver, nickel, palladium, copper or others to such facilitate bonding.

A hardened body of an adhesive encapsulant material seals the chip pad 6, the semiconductor chip 12, the conductive wire 16 and the leads 8. That is, the hardened encapsulant covers the semiconductor chip 12, the conductive wires 16, the sides of the chip pad 6, the first and third surfaces 6a and 6c of the chip pad 6, and the first, third surfaces and fourth surfaces 8a, 8c and 8d and the peripheral sides of the leads 8. The second surface 6b of the chip pad 6 and the two regions of second surface 8b of the leads 8 are not covered with the encapsulant 18 but rather are exposed to the outside in the horizontal plane of the lower exterior surface of the body of encapsulant 18. Depending on the location of sawing line S, the outer region of second surface 8b of leads 8 can extend beyond the perimeter of encapsulant 18 onto an outer stub of the severed lead 8.

Here, by having third surface 8c and fourth surface 8d covered by encapsulant 18, leads 8 are locked to encapsulant 18. Further, by having third surface 6c around exposed second surface 6b of chip pad 6 covered by encapsulant 18, chip pad 6 is locked to encapsulant 18. That is, the leads 8 and chip pad 6 are prevented from being separated from the encapsulant 18 horizontally or vertically.

Moreover, by having a narrow fourth surface 8d at the inner end of leads 8, and by forming a narrow third surface 8c at an intermediate area of a longitudinal direction of the lead 8, vibration or bending of the lead 8 during the wire bonding or molding process is prevented while maintaining a secure lock between encapsulant 18 and leads 8. That is, generally, a vibration or bending of the lead 8 can occur during the wire bonding or molding process. Such vibration or bending can be avoided by forming fourth surface 8d longitudinally short or, optionally, omitted it altogether. For example in FIGS. 4a, 5a, and 6a, fourth surface 8d is fully inward of the point of connection of wire 16 to first surface 8a of lead 8.

There are various methods for forming the body of encapsulant 18. For example, the body of encapsulant 18 may be formed using a common plastic molding technique. In such method, the leadframe is located in a transfer or injection mold and encapsulant material is provided on the upper surface of the leadframe and subsequently cured. The molding process is done in a manner that underfills third surface 6c of chip pad 6 and third and fourth surfaces 8c and 8d of leads 8, while leaving second surface 6b of chip pad 6 and second surface 8b of leads 8 uncovered and exposed. The encapsulant may be a common epoxy molding compound. As examples of molding compounds include NITTO MP-8000AN™ molding compound provided by the Nitto Company in Japan and EME 7351 UT™ provided by the Sumitomo Company in Japan. A side of the mold is tapered, resulting in a taper on the peripheral sides of the body of encapsulant 18, so that the encapsulated leadframe can be easily removed from the mold. Typically, the body of encapsulant 18 is individualized, that is, molded as a distinct unit over each leadframe 18. Accordingly, the leadframe may be sawed or punched around the respective body of encapsulant 18 along sawing line S through leads 8 inside of frame 2.

Instead of the molding method, a liquid-type encapsulating method may be used. For example, in a first step, the leadframe is located on a horizontal surface. In a second step, a common contact bead of hardenable adhesive material, such as HYSOL 4451™ epoxy provided by the Dexter-Hysol Company of City of Industry in California, can be coated on the leadframe to form a closed angle dam at a predetermined area of the lead around the semiconductor chip. In a third step, the bead is hardened by a process, such as heating at a temperature of about 140 degrees for an hour. In a fourth step, the hardenable liquid-type encapsulating material, such as HYSOL™ 4450 liquid type encapsulant material, is poured over the leadframe the inside of the bead to form the package body. In a final step, the poured liquid-type encapsulant is hardened, for example, by heating at a temperature of about 140 degrees for an hour. Typically, all leadframes of the strip would be encapsulated in one block of encapsulant, although each leadframe also could be encapsulated in an individual block of encapsulant 18. Subsequently, a sawing step is carried out along line S for singulating the individual packages from the block of encapsulant over the strip of leadframes.

Specific areas of the leadframe that are not covered with the encapsulant 18, such as the second surface 6b of the chip pad 6 and the second surface 8b of the lead 8, may be plated with a common plating metal or metals, such as gold, nickel, palladium, inconel, solder of lead and tin, or tantalum. Such plating may be performed in the step of manufacturing the leadframe. The plated regions may easily be soldered to a motherboard.

Practitioners will appreciate that chip pad 6 can be up set during the encapsulation process, so that second surface 6c is covered by encapsulant 18 in the semiconductor package.

Referring to FIGS. 5a and 5b, the semiconductor package 202 is very similar to package 201 of FIGS. 4a and 4b, having common parts and reference numbers, and hence needs only be described with respect to differences from the semiconductor package 201.

In semiconductor package 202 of FIGS. 5a and 5b, the leads 8 of leadframe 102 of FIGS. 3a, 3b, and 3c have a recessed third surface 8c extending between second surface 8b and sawing line S adjacent frame 2. As shown in FIG. 5b, the one region of exposed second surface 8b of the lead 8 is located fully within the peripheral sides of the body of encapsulant 18, since third surface 8c is covered by encapsulant 18 and is between second surface 8b and the adjacent package side. An optional fourth surface 8d is formed at the inner end of lead 8 opposite the third surface 8c at the outer end of the lead 8, such that third surface 8c and fourth surface 8d are covered by encapsulant 18. Accordingly, the locking force or binding force between the lead 8 and the encapsulant 18 is enhanced.

Generally, a bur may be generated by a punching step performed after encapsulation to singulate an individually encapsulated packages from the leadframe strip. The bur (not shown) is directed downward at the line of cut through lead 8. In the case of leadframe 102 and package 202, however, the effect of any bur is minimized by providing third surface 8c at cutting line S and away from second surface 8b. Any such bur would therefore be formed at third surface 8c and not as second surface 8b. Since second surface 8b is free of any such bur, semiconductor package 202 may be mounted easier to a motherboard.

Referring to FIGS. 3a, 3b, 6a and 6b, the semiconductor package 203 made from leadframe 103 is similar to semiconductor package 201 and has similarly numbered features. Thus, semiconductor package 203 need only be discussed in terms of its differences.

As shown in the drawings, the leadframe 103 and package 203 further includes the flat-type fourth surface 6d at the bottom of a rectangular groove formed in the first surface 6a of the chip pad 6 on which the semiconductor chip 12 is mounted. Fourth surface 6d is vertically recessed from first surface 6a, and in this embodiment surrounds chip 12.

In one application, one or more input-output pads 14 for ground or some other voltage of the semiconductor chip 12 are electrically connected to the fourth surface 6d by a conductive wire 16, as is shown in FIG. 6a. In such an application, bonding means 22 may be electrically insulative to isolate the backside of chip 12, or bonding means 22 may be electrically conductive to apply a backside potential to chip 12. Further, the exposed second surface 6b of chip pad 6 may be electrically connected by solder, solder paste, or an electrically conductive adhesive to a ground or other voltage terminal of a motherboard.

By having the fourth surface 6d located in a groove of first surface 6a of chip pad 6, the chip pad 6 is bonded and bound to the encapsulant 18 more strongly because of the increased surface area provided by the groove. Furthermore, by bonding the conductive wires 16 to fourth surface 6c within the groove, the conductive wires 16 are prevented from being separated from the fourth surface 6d of the chip pad 6, which might otherwise occur due to thermal expansion or molding.

Of course, the fourth surface 6d of the chip pad 6 may be plated with a metal, such as gold, silver, nickel, palladium and copper, so as to strengthen the bond to conductive wires 16.

In package 302 of FIGS. 6a and 6b, fourth surface 8d of the lead 8 is formed only at the inner end of the leads 8 adjacent to chip pad 6. There is no third surface 8c as in semiconductor packages 201 and 202. The exposed second surface 8b of lead 8 extends longitudinally from fourth surface 8c to the outer end of lead 8 that is at or just beyond the peripheral edge of encapsulant 18.

Practitioners will appreciate that a chip pad 6 having a groove bottomed by a fourth surface 6d, and one or more conductive wire(s) connected therein, as in FIGS. 6a and 6b, could be substituted into the semiconductor packages 201 and 202.

Therefore, according to embodiments of the present invention, the leadframes semiconductor packages made therewith have leads with one or more undercuts in its lower surface, thereby forming recessed horizontal surfaces, which subsequently are underfilled with encapsulant material, thereby improving the bonding force and binding force between the lead and the package body.

Furthermore, the chip pad may have a recessed fourth surface formed in the upper surface of the chip pad upon which the semiconductor chip is mounted. The fourth surface is in a groove that is encapsulated, thereby improving the bonding force and binding force between the chip pad and the encapsulant.

Moreover, to improve the binding force between the leads and the encapsulant, a recessed third surface can be formed across the lead at a center area of the longitudinal direction of the lead, or at an area of lead adjacent at the side of the package, thereby preventing the vibration or bending of the lead during the wire bonding or molding process and better locking the lad to the package body.

Additionally, if the recessed third surface of the leads is formed where the leads are cut by punching during package singulation, then a bur that may be formed during the punching step will not be located on the second surface of the lead that is electrically connected to the mother board. Accordingly, the semiconductor package can be contacted to the mother board more closely, thereby increasing the mounting efficiency.

Furthermore, when the recessed fourth surface is formed in a groove in an upper top surface of the chip pad, and one or more wires are bonded to the fourth surface within the groove, then the strong bond between the fourth surface and the encapsulant in the recess helps control the heat expansion and prevent the separation of the conductive wire from the fourth surface.

While the present invention has been described with reference to the particular illustrative embodiments, it is not to be restricted to the embodiments but only by the appended claims. It is to be appreciated that those skilled in the art can change or modify the embodiments without departing from the scope and spirit of the present invention.

What is claimed is:

1. A semiconductor package comprising:
   a chip pad;
   a plurality of leads each including an inner end adjacent to the chip pad, an opposite outer end, a generally planar first surface which extends to both the inner and outer ends, a generally planar second surface opposite the first surface, and a generally planar third surface which is opposite the first surface and extends to the outer end, the third surface further being recessed relative to the second surface and extending completely between the second surface and the outer end such that no portion of the second surface extends between the third surface and the outer end and the second surface is separated from the outer end by the third surface to reduce burr the formation on the second surface;
   a semiconductor chip mounted on the first surface of the chip pad and in an electrical connection with the first surface of at least some of the leads; and
   a package body of a hardened encapsulant material over the chip, the package body defining a first exterior surface, a second exterior surface which is opposite the first exterior surface, a first exterior first side surface which extends between the first and second exterior surfaces, and a second exterior second side surface which extends to the first exterior surface;
   wherein the third surface of each of the leads is covered by the encapsulant material to facilitate the locking of the leads thereto, the second surface of each of the leads and the second surface of the chip pad are exposed in a plane of the first exterior surface of the package body, and a portion of the first surface of each of the leads which begins at the outer end is exposed in a plane of the second exterior surface of the package body such that the exposed portion of the first surface protrudes from the second exterior side surface.

2. The semiconductor package of claim 1 wherein each of the leads further includes a fourth surface which is opposite the first surface and extends between the second surface and the inner end, the fourth surface of each of the leads being covered by the package body.

3. The semiconductor package of claim 2 wherein the third surface begins at the outer end and the fourth surface begins at the inner end.

4. The semiconductor package of claim 1 wherein the third surface begins at the outer end.

5. The semiconductor package of claim 4 wherein the outer end of each of the leads is substantially flush with the first exterior side surface.

6. The semiconductor package of claim 1 wherein the chip pad has a first surface, a second surface opposite a central portion of the first surface, and a third surface opposite a peripheral portion of the first surface and surrounding the second surface, the third surface being recessed from the second surface.

7. The semiconductor package of claim 6 wherein the first surface of the chip pad includes a groove bottomed by a fourth surface, the groove extending in a ring adjacent to peripheral sides of the chip pad, at least one conductive wire is electrically connected between the semiconductor chip and the fourth surface within the groove, and the groove is filled with the encapsulant material.

8. The semiconductor package of claim 1 wherein the semiconductor chip is electrically connected to the first surface of at least one of the leads by a wire which is covered by the package body.

9. A semiconductor package comprising:
a chip pad having a first surface, a second surface opposite a central portion of the first surface, and a third surface opposite a peripheral portion of the first surface and surrounding the second surface, the third surface being recessed from the second surface;
a plurality of leads each including an inner end adjacent to the chip pad, an opposite outer end, a first surface, a second surface opposite the first surface, a third surface which is opposite the first surface and extends between the second surface and the outer end, and a fourth surface which is opposite the first surface and extends between the second surface and the inner end;
a semiconductor chip mounted on the first surface of the chip pad and in an electrical connection with the first surface of at least some of the leads; and
a package body of a hardened encapsulant material over the chip and at least the first and third surfaces of the chip pad, wherein the third and fourth surfaces of each of the leads is covered by the encapsulant material, the second surface of each of the lead and the second surface of the chip pad are exposed in a plane of a first exterior surface of the package body, and a portion of the first surface of each of the leads is exposed in a plane of a second exterior surface of the package body.

10. The semiconductor package of claim 9 wherein the third surface of each of the leads begins at the outer end thereof and the fourth surface begins at the inner end thereof.

11. The semiconductor package of claim 9 wherein the third surface of each of the leads begins at the outer end thereof.

12. The semiconductor package of claim 11 wherein the package body defines a package side and the outer end of each of the leads is substantially flush with the package side.

13. The semiconductor package of claim 9 wherein the first surface of the chip pad includes a groove bottomed by a fourth surface, the groove extending in a ring adjacent to peripheral sides of the chip pad, at least one conductive wire is electrically connected between the semiconductor chip and the fourth surface within the groove, and the groove is filled with the encapsulant material.

14. The semiconductor package of claim 9 wherein the semiconductor chip is electrically connected to the first surface of at least one of the leads by a wire which is covered by the package body.

15. A semiconductor package comprising:
a chip pad;
a plurality of leads each including an inner end adjacent to the chip pad, an opposite outer end, a generally planar first surface which extends to both the inner and outer ends, a generally planar second surface opposite the first surface, and a means for locking the lead to a package body which is opposite the first surface and extends to the outer end, the locking means further extending completely between the second surface and the outer end such that no portion of the second surface extends between the locking means and the outer end and the second surface is separated from the outer end by the locking means to reduce burr the formation on the second surface;
a semiconductor chip mounted on the first surface of the chip pad and in an electrical connection with the first surface of at least some of the leads; and
wherein the package body is a hardened encapsulant material and defines a first exterior surface, a second exterior surface which is opposite the first exterior surface, a first exterior first side surface which extends between the first and second exterior surfaces, and at second exterior second side surface which extends to the first exterior surface, the package body covering the chip and the locking means of each of the leads such that the second surface of each of the leads and the second surface of the chip pad are exposed in a plane of the first exterior surface of the package body, and a portion of the first surface of each of the leads which begins at the outer end is exposed in a plane of the second exterior surface of the package body such that the exposed portion of the first surface protrudes from the second exterior side surface.

16. The semiconductor package of claim 15 wherein the locking means further extends between the second surface and the inner end.

17. The semiconductor package of claim 16 wherein the locking means includes a first portion which begins at the outer end and a second portion which begins at the inner end.

18. The semiconductor package of claim 15 wherein the locking means begins at the outer end.

19. The semiconductor package of claim 15 wherein the chip pad includes a first surface, a second surface opposite a central portion of the first surface, and a third surface opposite a peripheral portion of the first surface and surrounding the second surface, the third surface being recessed from the second surface.

20. The semiconductor package of claim 19 wherein the first surface of the chip pad includes a groove bottomed by a fourth surface, the groove extending in a ring adjacent to peripheral sides of the chip pad.

* * * * *